(12) United States Patent
Kornrumpf et al.

(10) Patent No.: US 6,559,389 B1
(45) Date of Patent: May 6, 2003

(54) HIGH-DENSITY CABLE AND METHOD THEREFOR

(75) Inventors: William Paul Kornrumpf, Schenectady, NY (US); Lowell Scott Smith, Niskayuna, NY (US); Douglas Glenn Wildes, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 3 days.

(21) Appl. No.: 09/617,941

(22) Filed: Aug. 25, 2000

(51) Int. Cl.[7] .................................................. H05K 1/03
(52) U.S. Cl. ......................... 174/254; 174/261; 29/829
(58) Field of Search .............................. 174/254, 255, 174/261, 113 R, 177 FF; 361/749, 750, 751; 29/829

(56) References Cited

U.S. PATENT DOCUMENTS

| | | | |
|---|---|---|---|
| 3,383,564 A | * | 5/1968 | Lalmond et al. ............. 317/101 |
| 3,465,308 A | * | 9/1969 | Sasaki et al. ................ 340/174 |
| 5,527,741 A | | 6/1996 | Cole et al. |
| 5,700,979 A | * | 12/1997 | Lewis et al. ............. 174/117 F |
| 5,795,299 A | | 8/1998 | Eaton et al. |
| 5,844,783 A | * | 12/1998 | Kojima ....................... 361/777 |
| 5,909,004 A | | 6/1999 | Hedengren et al. |
| 6,281,451 B1 | * | 8/2001 | Chan et al. ................. 174/262 |
| 6,323,428 B1 | * | 11/2001 | Takano .................... 174/117 F |

OTHER PUBLICATIONS

Imagin Medical Probe Cables, A New Vision for Transducer Imaging Technology, Gore Creative Technologies, 7 Pages, 10/99.
Flat Out! Microflat Cables, High Density and Automated Assembly, WL Gore & Assoc., Inc, 1 Page 10/97.
Micro Interconnect Technology, Precision Interconnect Corp., 5 Pages, 1992.

* cited by examiner

*Primary Examiner*—David L. Talbott
*Assistant Examiner*—Jeremy Norris
(74) *Attorney, Agent, or Firm*—Armstrong Teasdale LLP; Robert B. Reeser, III

(57) ABSTRACT

A high-density cable of a type suitable for transmitting ultrasound signals from an ultrasonic probe to multiplexing circuitry during a medical ultrasound procedure is provided. The cable includes one or more flexible circuits arranged within a flexible sheath that surrounds and confines the flexible circuits. Each flexible circuit includes an elongate flexible substrate with oppositely-disposed surfaces and multiple conductors on at least one of these surfaces. The opposing longitudinal ends of the substrate define integral connectors for connecting with respective output connectors and/or electronic devices, such as an ultrasonic probe or multiplexing circuitry.

31 Claims, 1 Drawing Sheet

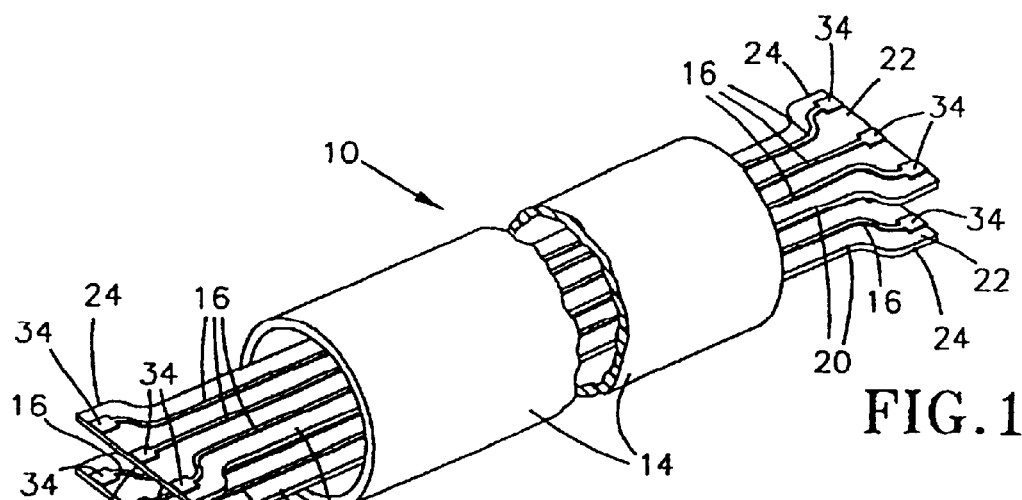
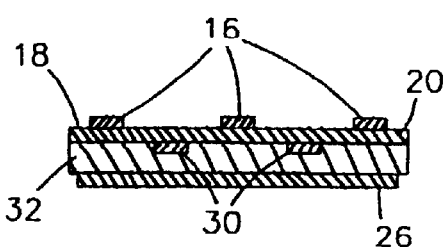
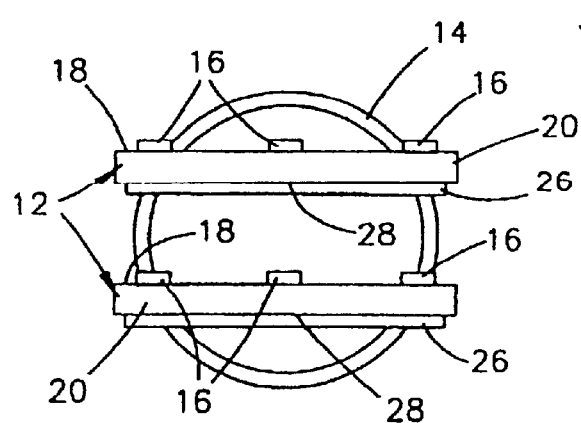
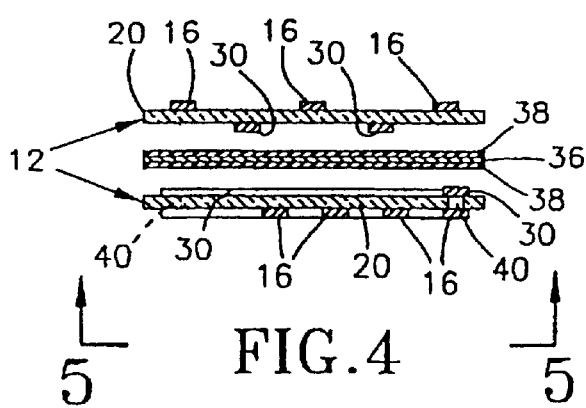
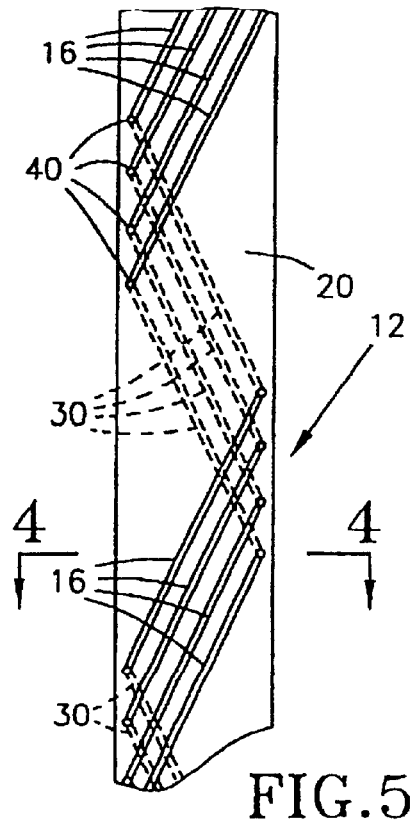

HIGH-DENSITY CABLE AND METHOD THEREFOR

FIELD OF THE INVENTION

The present invention generally relates to electronic interconnect devices used to provide a communications path between electronic devices. More particularly, this invention relates to a high-density cable comprised of flexible circuits with integral terminations, and a method for manufacturing the cable.

BACKGROUND

Medical ultrasound procedures employ an ultrasonic probe with piezoelectric transducer elements connected to multiplexing circuitry that is remotely located from the element and processes the ultrasound signals from the probe. Due to the quantity of signals generated, high-density cables are necessary to faithfully transmit the ultrasound signals to the multiplexing circuitry.

Multiconductor coaxial cables have been used to connect ultrasound equipment as well as numerous other electronic devices. These cables contain as many as five hundred to six hundred very small (e.g., less than 0.015 inch (about 0.4 mm)) coaxial conductors in a round sheath. Each coaxial conductor contains a center conductor of very small diameter wire that is fragile and therefore difficult to work with. Due to the fragility of the center conductors, each end of the cable must be connected to a fanout board to enable the cable to be reliably connected to the probe and multiplexing circuitry. During the process of terminating the cable, each individual coaxial conductor must be identified and connected to the proper fanout board terminal. This process is time-consuming and difficult to automate due to the size and fragility of the conductors, which drives up the cost of these cables. Another shortcoming is that a cable containing five hundred or more coaxial conductors is relatively large and stiff, which renders the cable rather difficult to use for diagnostics in a clinical environment.

From the above, it can be seen that it would be desirable if a relatively flexible and pliable high-density cable were available that did not require an assembly and termination process as intensive as conventional coaxial cables.

BRIEF SUMMARY OF THE INVENTION

The present invention provides a high-density cable that is suitable, for example, for transmitting ultrasound signals from an ultrasonic probe to an output connector and/or multiplexing circuitry during a medical ultrasound procedure. The output connector may or may not include multiplexing circuitry and/or tuning inductors, for example. The cable is less complicated to fabricate and terminate than conventional multiconductor cables that include individual coaxial conductors, thereby reducing the cost of the cable without any loss in transmission capability.

The cable of this invention includes one or more (at least one) flexible circuits that are arranged within a flexible sheath that surrounds and confines the flexible circuits. Each flexible circuit includes an elongate flexible substrate with oppositely-disposed surfaces and multiple conductors on at least one of these surfaces. The opposing longitudinal ends of the substrate define integral connection regions for (a) connecting with a mating connector of an electronic device, such as an ultrasonic probe or multiplexing circuitry and/or (b) connecting the cable with a mating connector of an output connector which in turn is connected with an electronic device. Accordingly, the conductors of the flexible circuits do not require termination by a separate fanout board, such that the cable is essentially ready for use with the flexible circuits in an as-manufactured condition.

From the above, it can be appreciated that the high-density cable of this invention does not require an assembly and termination process as intensive as conventional coaxial cables, and can be produced by automated processes at a lower cost than coaxial cables without any loss in transmission capability. More particularly, the cable does not require termination with a separate fanout board, but instead is equipped with connection regions that are integrally formed with the flexible substrates that carry the conductors necessary for signal transmission. The flexible circuits thus formed can then be arranged and encased in the flexible sheath. To facilitate the assembly process, individual conductors of each flexible circuit can be coded or otherwise identified to ensure that the flexible circuits are properly arranged in the stack within the cable. The cable is then ready for connection to the desired electronic devices, with each connection region of the cable being directly coupled with a connector of one of the electronic devices.

Other advantages of this invention will be better appreciated from the following detailed description.

BRIEF DESCRIPTION OF THE DRAWINGS

FIG. 1 is a perspective view of a high-density cable assembly comprised of multiple flexible circuits in accordance with the present invention.

FIG. 2 is an end view of the high-density cable of FIG. 1.

FIGS. 3 and 4 are cross-sectional views of alternative flexible circuits for use in the high-density cable of FIG. 1.

FIG. 5 is a plan view of the lower flexible circuit of FIG. 4.

DETAILED DESCRIPTION OF THE INVENTION

A flexible high-density cable 10 in accordance with one embodiment of this invention is represented in FIG. 1. The cable 10 is of the type for establishing electronic communications between two electronic devices, particular examples here being an ultrasonic probe and the multiplexing circuitry used to process ultrasound signals produced by the probe during a medical ultrasound procedure. Contrary to prior art coaxial cables used in ultrasound procedures, the flexible cable 10 of this invention does not contain individual coaxial conductors, but instead is comprised of multiple flexible circuits 12 that are stacked and confined within a sheath 14.

Similar to flexible circuits designed for other electronic applications, the flexible circuits 12 employed with this invention are fabricated by forming conductors 16 on at least one surface 18 (shown in FIG. 2) of a flexible substrate 20. The material of the substrate 20 is a dielectric material, such as a polyimide or polyester film, though other materials could foreseeably be used. The material, width and thickness of the substrates 20 will affect the flexibility of the flexible circuits 12 and the cable 10. A suitable width and thickness for a substrate 20 formed of polyimide are on the order of about 10 millimeters and about 0.050 millimeters, respectively, though significantly smaller and larger substrates 20 are within the scope of the invention.

For purposes of example, flexible circuits 12 are shown in FIG. 1 as being arranged substantially parallel to each other with conductors 16 which in turn are substantially parallel to each other. Although this embodiment is useful for very high density and/or low physical space embodiments, the present invention is not limited to this embodiment. Having the flexible circuits arranged in a non-parallel manner may be useful for reducing crosstalk, for example. As another example, arranging the flexible circuits in a spiral or other non-flat configuration (as compared with the substantially flat/planar orientation of FIG. 1) may provide a more flexible cable. As yet another alternative or additional example, staggering or offsetting the flexible circuits within the cable may be useful for reducing crosstalk and/or for increasing cable flexibility.

In the example of FIG. 1, each substrate 20 has oppositely disposed connector ends 22, each of which terminates at a fanout section 24 whose lateral width is generally greater than the remainder of the substrate 20. The conductors 16 terminate at the connector ends 22, which are configured to be capable of electrically connecting a corresponding flexible circuit 12 to an output connector and/or another electronic device, such as the conductors of an ultrasonic probe or multiplexing circuitry. The conductors 16 are generally spread apart at the connector ends 22 to allow more space for connection to a transducer or multiplexor. The conductors 16 may be on the order of about 25 micrometers in width and spaced about 25 micrometers apart. As shown in FIG. 1, the conductors 16 terminate with connection pads 34 that are preferably larger, such as about 0.25 mm in width and spaced about 0.25 mm apart, to allow for ease of assembly in both manual and automated systems. Sheath 14 "surrounds" flexible circuits 12 in that the sheath is situated around at least most of the length of the flexible circuits but is not necessarily situated around the connector ends or the portion of the cable adjacent the connector ends.

The present invention is not limited to the fanout embodiment of FIG. 1. For example, in an alternative embodiment, the flexible circuit is of constant width (the ends of the flexible circuit are not wider than the middle portion of the flexible circuit). Additionally, separate connection pads 34 are not required. For example, a connection can be made directly to conductors 16.

On each surface 18 and 28 (shown in FIG. 2) of the substrate 20 the pads 34 can be arranged in the fanout section 24 to be in the same order as their corresponding conductors 16 on the substrate 20. As a result, selection and manual sorting of the pads 34 are not required to properly connect the cable 10 to the connectors of an ultrasonic probe and multiplexing circuitry, or any other devices to be connected with the cable 10.

Photolithographic techniques well known in the flexible circuit art can be used to form the conductors 16. With a conductor width and spacing of about twenty-five micrometers, as many as two hundred conductors 16 can be accommodated on the surface 18 of a single flexible circuit 12 having a width of about 10 mm. Alternative methods for forming the conductors 16 include laminating copper foil or selectively pattern-plating copper directly onto the substrate 20. The individual conductors 16 of each flexible circuit 12 are precisely fabricated in a predetermined orientation on the surface 18, and can be coded or otherwise identified to ensure that each circuit 12 is properly placed in the stack within the cable 10.

FIG. 2 shows the flexible circuits 12 as also having an integral conductive sheet 26 on the surface 28 of the substrate 20 opposite the conductors 16. The conductive sheets 26 serve to reduce RF interference of the signals being transmitted by the conductors 16 and can optionally function as ground planes and/or current return paths. As depicted in FIG. 3, conductors 30 can be formed on both surfaces 18 and 28 of a substrate 20 to increase the number of conductors on each circuit 12 without increasing the width of the substrates 20. In this embodiment, a dielectric material, such as polyester or TEFLON® (polytetrafluoroethylene or PTFE), is applied to the surface 28 to embed its conductors 30 and provide a dielectric barrier layer 32 between the conductors 30 and the conductive sheet 26. As represented in FIG. 3, the conductors 16 and 30 are preferably laterally offset from each other in order to reduce crosstalk between the conductors 16 and 30. Likewise, laterally offsetting conductors of nearby or adjacent flexible circuits is also beneficial for reducing the likelihood of crosstalk.

The construction of FIG. 3 can be simplified using the construction shown in FIG. 4, in which a separate conductive sheet 36 is sandwiched between a pair of dielectric barrier layers 38, which are then inserted between adjacent flexible circuits 12 without requiring attachment of the barrier layers 38 to the substrates 20. The individual conductors 16 and 30 on any given circuit 12 can be patterned as shown in FIGS. 4 and 5 to include vias 40 that interconnect the conductors 16 and 30 on opposite surfaces 18 and 28 of the substrates 20. In this way, the orientation of the conductors 16 and 30 shown in FIGS. 1 and 2 can be modified as shown in FIG. 5, for example, in which the conductors 16 are parallel to each other but not to the conductors 30, and each conductor 16 is electrically connected to a conductor 30 through a via 40. In this embodiment, crosstalk coupling can be reduced between conductors 16 and 30.

The flexible sheath 14 surrounding the flexible circuits 12 can be formed of sheathing material of a type typically used for high-density cables, such as polyvinyl chloride (PVC) or silicone rubber. Other materials may be used for the sheath 14 as long as the material is sufficiently supple to enable the cable 10 to remain flexible so as not to hinder its use in a diagnostic procedure. Any number of the flexible circuits 12 can be arranged to form the cable 10. In the embodiment of FIG. 1, the flexible circuits are stacked in parallel and allowed to float within the sheath 14 to promote the flexibility of the cable 10. For transmitting ultrasonic signals between an ultrasonic probe and its associated output connector and/or multiplexing circuitry, a suitable number of flexible circuits 12 is believed to be about thirty-six to about six hundred, though a greater or lesser number could be used. Accordingly, based on the number of conductors 16 that can be accommodated on a single flexible circuit 12, more than one hundred twenty-eight conductors 16 can be readily provided by the cable 10 of this invention, without causing the cable 10 to be insufficiently flexible for its intended use. The cable 10 of this invention is then ready for connection to any electronic device (not shown) suitably equipped with mating connectors, with each connector end 22 of the cable 10 being coupled with a corresponding connector of one of the electronic devices.

While the invention has been described in terms of a preferred embodiment, it is apparent that other forms could be adopted by one skilled in the art. Accordingly, the scope of the invention is to be limited only by the following claims.

What is claimed is:

1. A cable comprising:
   at least one flexible circuit comprising a flexible substrate with oppositely-disposed surfaces, multiple conductors on at least a first of the surfaces, and oppositely-disposed connector ends integral with the substrate; and a flexible sheath surrounding the at least one flexible circuit and confining the at least one flexible circuit therein.

2. A cable according to claim 1, wherein each of the connector ends is defined at a portion of its corresponding substrate that is wider in a lateral direction than the remainder of its corresponding substrate between the connector ends thereof.

3. A cable according to claim 1, further comprising means for electrically connecting each of the connector ends to an electronic device.

4. A cable according to claim 1, further comprising multiple conductors on a second of the surfaces of the substrate.

5. A cable according to claim 4, wherein the conductors on the second surface are laterally offset from the conductors on the first surface so as to reduce crosstalk therebetween.

6. A cable according to claim 4, wherein the conductors on the second surface are individually connected to the conductors on the first surface with conductive vias through the substrate.

7. A cable according to claim 1, wherein the at least one flexible circuit further comprises an integral conductive sheet on a second of the surfaces of the substrate thereof.

8. A cable according to claim 1, wherein the at least one flexible circuit comprises at least two flexible circuits and further comprising a conductive sheet separating at least two of the flexible circuits.

9. A cable according to claim 1, wherein the cable is connected to an output connector.

10. A cable according to claim 1, wherein the cable is connected to electronic devices, each of the connector ends being coupled with a connector of one of the electronic devices.

11. A cable according to claim 10, wherein one of the electronic devices is a piezoelectric transducer, and a second of the electronic devices is multiplexing circuitry of a medical ultrasonic device.

12. A cable comprising:
a plurality of flexible circuits arranged substantially parallel to each other, each of the flexible circuits comprising a flexible substrate with oppositely-disposed surfaces, oppositely-disposed lateral edges, multiple conductors on at least a first of the surfaces, oppositely-disposed connector ends integral with the substrate, and means for electrically connecting each of the connector ends to an electronic device;
an integral conductive sheet between at least two of the flexible circuits; and
a flexible sheath surrounding the flexible circuits and confining the flexible circuits therein.

13. A cable according to claim 12, further comprising multiple conductors on a second of the surfaces of the substrate.

14. A cable according to claim 13, wherein the conductors on the second surface are laterally offset from the conductors on the first surface so as to reduce crosstalk therebetween.

15. A cable according to claim 13, wherein the conductors on the second surface are individually connected to the conductors on the first surface with conductive vias through the substrate.

16. A cable according to claim 12, wherein the cable is connected to electronic devices, each of the connector ends being coupled with a connector of one of the electronic devices, one of the electronic devices being a piezoelectric transducer and a second of the electronic devices being multiplexing circuitry of a medical ultrasonic device.

17. A cable according to claim 12, wherein the cable is connected to an output connector of a medical ultrasonic device.

18. A method comprising the steps of:
providing at least one flexible substrate being formed to have oppositely-disposed surfaces and oppositely-disposed connector ends formed integrally therewith;
forming multiple conductors on at least a first of the surfaces of the at least one substrate, the at least one substrate thereby defining at least one flexible circuit; and
surrounding the at least one flexible circuit with a flexible sheath to confine the at least one flexible circuit therein and form a cable.

19. A method according to claim 18, wherein each of the connector ends is formed at a portion of its corresponding substrate that is wider in a lateral direction than the remainder of its corresponding substrate between the connector ends thereof.

20. A method according to claim 18, further comprising the step of forming means for electrically connecting each of the connector ends to an electronic device.

21. A method according to claim 18, further comprising the step of forming multiple conductors on a second of the surfaces of the substrate.

22. A method according to claim 21, wherein the conductors are formed on the second surface to be laterally offset from the conductors on the first surface so as to reduce crosstalk therebetween.

23. A method according to claim 21, further comprising the step of individually connecting the conductors on the first and second surfaces with conductive vias through the substrate.

24. A method according to claim 18, further comprising the step of forming an integral conductive sheet on a second of the surfaces of the at least one flexible circuit.

25. A method according to claim 18, wherein the at least one substrate comprises at least two substrates and the at least one flexible circuit comprises at least two flexible circuits and further comprising the step of separating at least two of the flexible circuits with a conductive sheet.

26. A method according to claim 18, further comprising the step of connecting the cable to electronic devices, each of the connector ends being coupled with a connector of one of the electronic devices.

27. A method according to claim 26, wherein one of the electronic devices is a piezoelectric transducer, and a second of the electronic devices is multiplexing circuitry of a medical ultrasonic device.

28. A method according to claim 27, further comprising the step of performing a medical ultrasound procedure with the electronic devices while coupled with the cable.

29. A method according to claim 18, further comprising the step of connecting the cable to an output connector.

30. A method according to claim 29, further comprising connecting the cable to a piezoelectric transducer and performing a medical ultrasound procedure.

31. A method according to claim 18, wherein the at least one substrate comprises at least two substrates and the at least one flexible circuit comprises at least two flexible circuits and further including arranging the at least two flexible circuits to be substantially parallel to each other.

* * * * *